(12) United States Patent
Lee

(10) Patent No.: US 9,119,316 B2
(45) Date of Patent: Aug. 25, 2015

(54) CASE AND DISPLAY DEVICE

(71) Applicant: Samsung Display Co., Ltd., Yongin, Gyeonggi-Do (KR)

(72) Inventor: Sang-Wol Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 142 days.

(21) Appl. No.: 13/795,185

(22) Filed: Mar. 12, 2013

(65) Prior Publication Data

US 2014/0029171 A1    Jan. 30, 2014

(30) Foreign Application Priority Data

Jul. 25, 2012   (KR) .................. 10-2012-0081296

(51) Int. Cl.
| | |
|---|---|
| *G06F 1/16* | (2006.01) |
| *H05K 7/16* | (2006.01) |
| *G09F 9/30* | (2006.01) |
| *H04M 1/02* | (2006.01) |

(52) U.S. Cl.
CPC ............... *H05K 7/16* (2013.01); *G06F 1/1652* (2013.01); *G09F 9/301* (2013.01); *H04M 1/0268* (2013.01)

(58) Field of Classification Search
USPC .......... 455/567, 418, 90.3, 575.4, 575.1, 566, 455/575.3, 41.2; 345/211, 30, 619, 204, 345/419, 418, 661, 168, 173, 174, 1.3, 80; 361/679.09, 679.23, 679.03, 679.02, 361/679.57, 679.29, 679.55, 679.04, 361/679.28, 679.3, 679.26, 679.16, 679.27, 361/679.01, 679.21; 312/223.1, 223.2, 312/223.3, 223.4, 216, 208.4; 349/58, 73, 349/62, 113
See application file for complete search history.

(56) References Cited

U.S. PATENT DOCUMENTS

| | | |
|---|---|---|
| 5,734,513 A | 3/1998 | Wang et al. |
| 6,377,324 B1 | 4/2002 | Katsura |
| 6,577,496 B1 | 6/2003 | Gioscia et al. |
| 2011/0122349 A1* | 5/2011 | Amimoto et al. ............. 349/113 |
| 2012/0033354 A1 | 2/2012 | Huang |
| 2012/0162568 A1* | 6/2012 | Sugawara ...................... 349/58 |

FOREIGN PATENT DOCUMENTS

| | | |
|---|---|---|
| EP | 2360517 A2 | 8/2011 |
| EP | 2403222 A1 | 1/2012 |
| EP | 2680547 A | 1/2014 |
| JP | 2006-072115 A | 3/2006 |
| KR | 10-2010-0049016 A | 5/2010 |
| KR | 10-2010-0082451 A | 7/2010 |
| KR | 10-2011-0100936 A | 9/2011 |

OTHER PUBLICATIONS

European Search Report issued on Jan. 7, 2014 by EPO in connection with European Patent Application No. 13177392.1 which also claims Korean Patent Application No. 10-2012-0081296 as its priority document.

* cited by examiner

*Primary Examiner* — Hung Duong
(74) *Attorney, Agent, or Firm* — Robert E. Bushnell, Esq.

(57) ABSTRACT

A case for supporting a foldable display panel includes a first main body located to correspond to a first area of the foldable display panel; a second main body located to adjoin the first main body and correspond to a second area of the foldable display panel, and folded in a direction of the first main body so that the second area of the foldable display panel faces the first area; and a mover, responsive to an elastic restitution force, located within at least the first main body to be supported by a rear surface of the foldable display panel, at least one of the first area and the second area of the foldable display panel being slidable in conjunction with the mover in a direction of at least one an end of the foldable display panel.

14 Claims, 11 Drawing Sheets

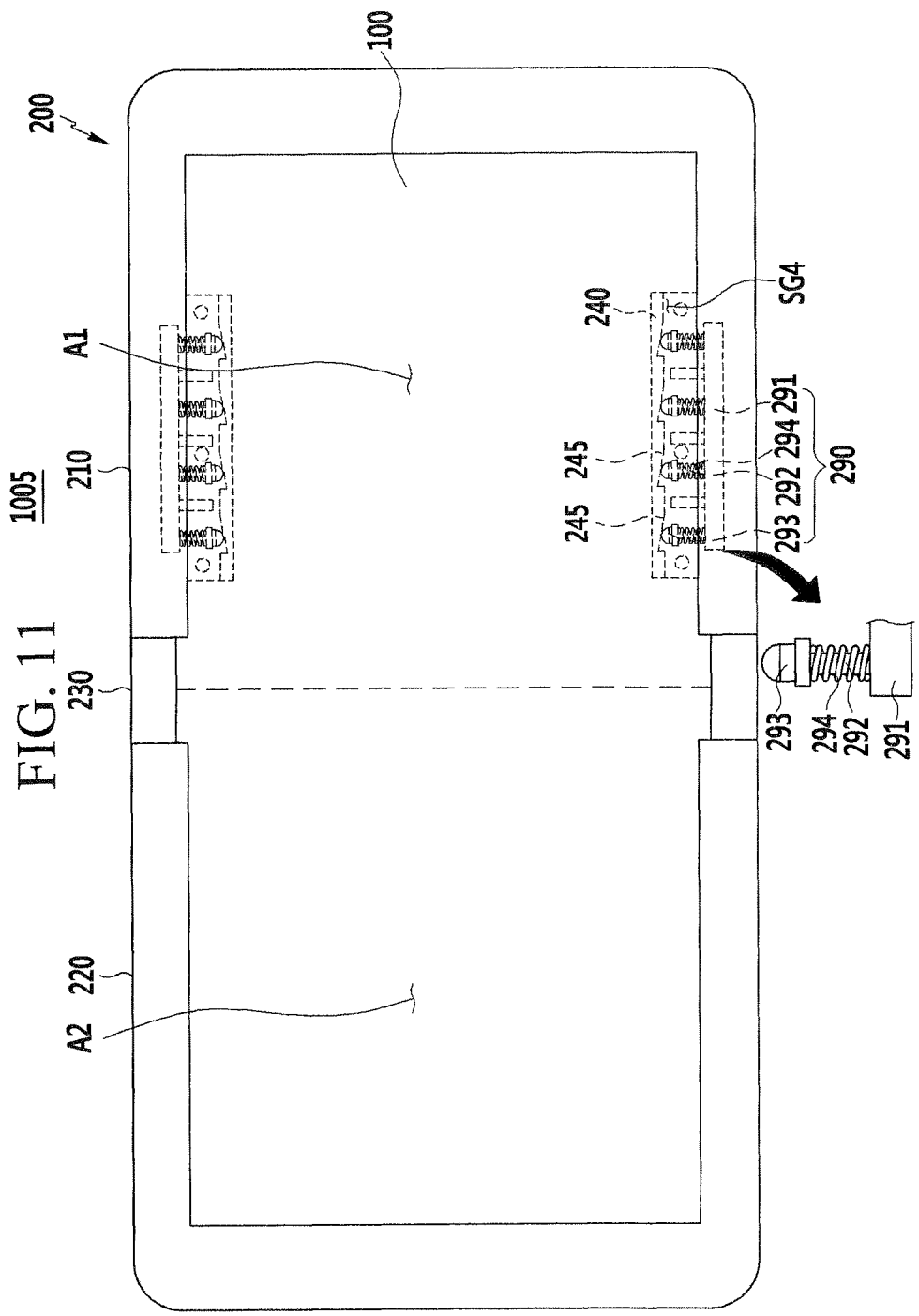

CASE AND DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 25 of Jul. 2012 and there duly assigned Ser. No. 10-2012-0081296.

BACKGROUND OF THE INVENTION

1. Field of the Invention

The described technology relates generally to a case and a display device, and more particularly, to a case for supporting a foldable display panel and a display device.

2. Description of the Related Art

A display device is a device for display an image, and an organic light emitting diode display is recently spotlighted.

The organic light emitting diode display has a self-light emitting characteristic, and thus does not require a separate light source unlike a liquid crystal display device, thereby reducing a thickness and a weight. Further, the organic light emitting diode display exhibits high definition characteristics, such as low power consumption, high luminance, a high reaction speed and the like.

Since the organic light emitting diode display has the self-light emitting characteristic, and thus does not have a backlight unit included in a liquid crystal display, the organic light emitting diode display may be implemented as a foldable display panel if a substrate is formed of flexible resin.

The foldable display panel is supported by a case, and thus is folded and unfolded by the case.

The above information disclosed in this section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a case, which easily folds or unfolds a foldable display panel, and a display device including the same.

An exemplary embodiment provides a case for supporting a foldable display panel, the case including: a first main body located to correspond to a first area of the foldable display panel; a second main body located to adjoin the first main body and correspond to a second area of the foldable display panel, and folded in a direction of the first main body so that the second area of the foldable display panel faces the first area; and a mover, responsive to an elastic restitution force, located within one or more of the first main body and the second main body to be supported by a rear surface of the foldable display panel, and slidable in a direction of an end of the foldable display panel.

The case may further include a hinge for connecting the first main body and the second main body.

Each of the first main body and the second main body may include a floating space adjoining the hinge and floating the foldable display panel.

A part of each of the first area and the second area of the foldable display panel may be floated in the floating space.

One or more of the first main body and the second main body may include a sliding guide groove for slidably guiding the mover.

The case may further include an elastic body mounted between one or more of the first main body and the mover and the second main body and the mover, and configured to generate the elastic restitution force.

The elastic body may include a coiled compression spring.

One or more of the first main body and the second main body may include a first stopper by which one end of the coiled compression spring is supported, and the mover may include a second stopper by which the other end of the coiled compression spring is supported.

The elastic body may include a coiled tension spring.

One or more of the first main body and the second main body may include a first fastener for fastening one end of the coiled tension spring, and the mover may include a second fastener for fastening the other end of the coiled tension spring.

The elastic body may include a torsion spring.

One end of the torsion spring may be fixed to the first main body or the second main body, and the other end of the torsion spring may be fixed to the mover.

The mover may include a taper surface tapering in a sliding direction of the mover, and the elastic body may come into contact with the taper surface, and generate elastic restitution force in an intersection direction crossing the sliding direction of the mover.

The elastic may include a supporting base supported by one or more of the first main body; a supporting shaft extending to the taper surface from the supporting base along the intersection direction; a rounded tip part supported by an end of the supporting shaft to be sildable in the intersection direction, and coming into contact with the taper surface; and a coiled compression spring having the supporting shaft inserted therein and mounted between the tip part and the supporting base.

Another exemplary embodiment provides a display device including: a foldable display panel for display an image; and the case for supporting the foldable display panel.

According to an exemplary embodiment, a case for easily folding or unfolding a foldable display panel and a display device including the same are provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 11 is a top plan view of a display device according to a fifth exemplary embodiment.

DETAILED DESCRIPTION OF THE INVENTION

Figure 1:
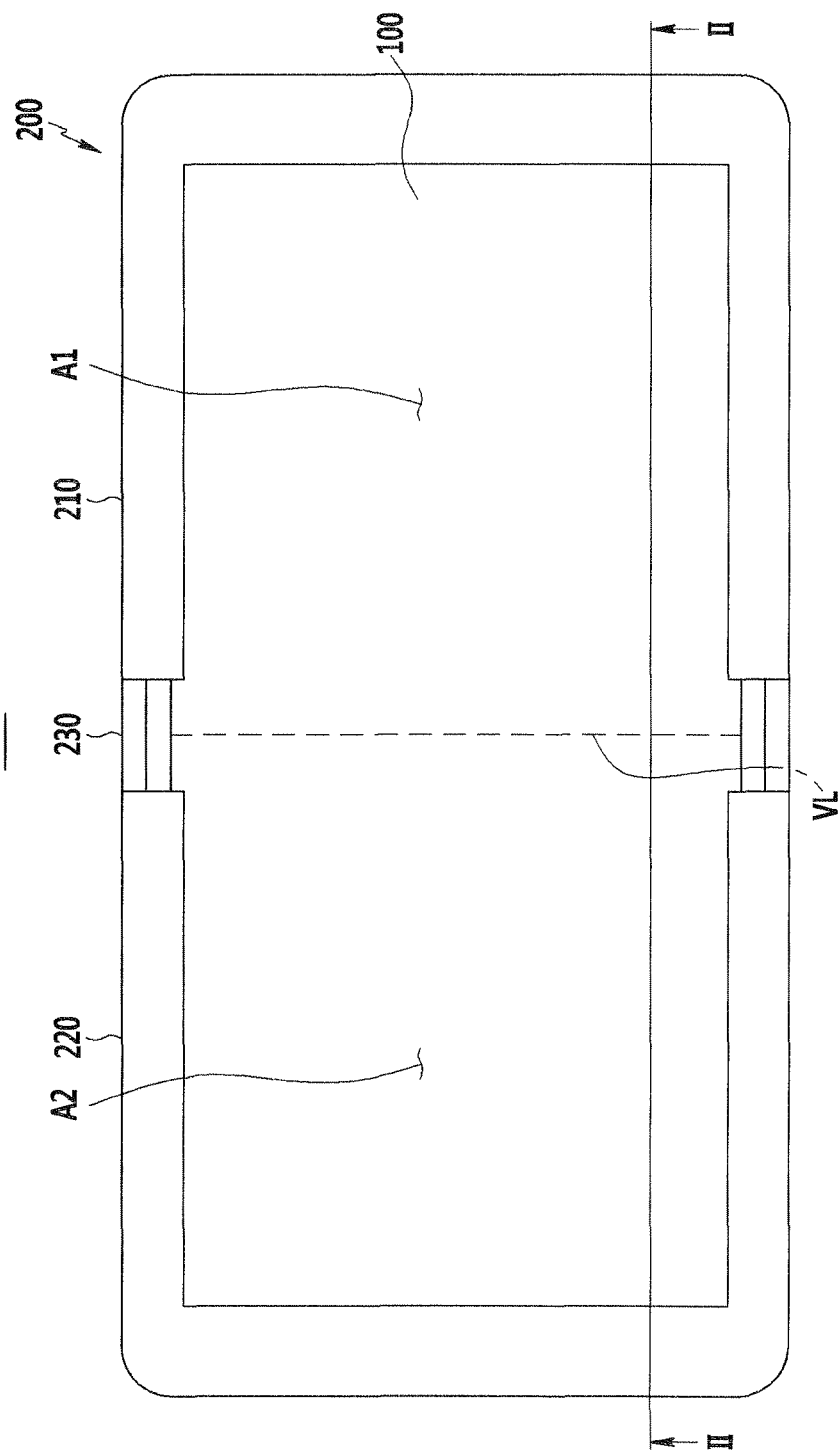
FIG. 1 is a top plan view of a display device according to a first exemplary embodiment.

Hereinafter, the various exemplary embodiments will be described in detail with reference to the accompanying drawings so that those skilled in the art can easily implement the exemplary embodiments. The present invention may be implemented in various different types, and is not limited to the exemplary embodiment described herein.

In order to clarify the present invention, parts irrelevant to the description of the present invention are omitted, and the same reference numerals will be used throughout to designate the same or like elements.

Further, in various exemplary embodiments, the same reference numerals are used for the elements having the same configuration and will be representatively described in a first exemplary embodiment, and in other exemplary embodiments, only elements different from those of the first exemplary embodiment will be described.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. Further, in the drawings, for understanding and ease of description, the thicknesses of some layers and areas are exaggerated.

In addition, unless explicitly described to the contrary, the word "comprise" and variations such as "comprises" or "comprising" will be understood to imply the inclusion of stated elements but not the exclusion of any other elements.

Hereinafter, a display device according to a first exemplary embodiment will be described with reference to FIGS. 1 to 4.

Figure 2:
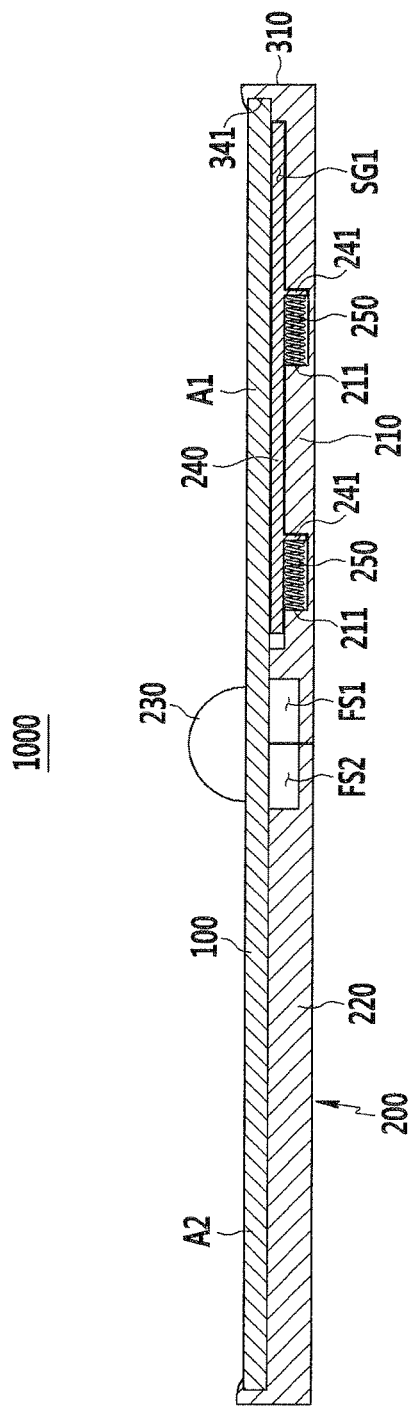
FIG. 2 is a cross-sectional view of the display device taken along the line II-II of FIG. 1.

FIG. 1 is a top plan view of the display device according to the first exemplary embodiment. FIG. 2 is a cross-sectional view of the display device taken along the line II-II of FIG. 1.

As illustrated in FIGS. 1 and 2, a display device 1000 according to the first exemplary embodiment includes a foldable display panel 100 and a case 200.

The foldable display panel 100 may include an organic light emitting diode, a liquid crystal, plasma, and/or a color capsule for displaying an image processed in the display device 1000. For example, when the display device 1000 is a mobile terminal, such as a mobile phone for one example, the display device 1000 can display an image of a user interface (UI) and/or a graphic user interface (GUI) which is related to phone communication. The foldable display panel 100 may include a flexible substrate and a film which face each other with the organic light emitting diode, the liquid crystal, the plasma, the color capsule therebetween. The foldable display panel 100 may be formed in a transparent type or a light transmitting type so as to look outside through the foldable display panel 100. A touch sensor, which has a type such as a touch film, a touch sheet, or a touch pad and detects a touch operation, may be located in a front surface of the foldable display panel 100. The foldable display panel 100 is folded by the case 200 along a virtual center line VL, and includes a first area A1 and a second area A2 which are adjacent to each other based on the center line VL.

The case 200 supports the foldable display panel 100, and includes a first main body 210, a second main body 220, a hinge 230, a mover 240, and an elastic body 250.

The first main body 210 adjoins the second main body 220 and is located to correspond to the first area A1 of the foldable display panel 100, and the first main body 210 of the display panel 100 is folded in a direction of the second main body 220 so that the first area A1 faces the second area A2. That is, the first main body 210 is folded together with the foldable display panel 100 in the direction of the second main body 220 so that the first area A1 of the foldable display panel 100 faces the second area A2. The first main body 210 may be formed of any material selected from an organic material, a metal material, or an inorganic material. The first main body 210 includes a first floating space FS1, a first sliding guide groove SG1, and a first stopper 211.

The first floating space FS1 is formed in a predetermined shape while adjoining the hinge 230, and a part of the first area A1 of the foldable display panel 100 floats over case 200.

The first sliding guide groove SG1 is formed in a dented type while corresponding to the first area A1 of the foldable display panel 100. A mover 240 is located in the first sliding guide groove SG1, and slidably guided along the first sliding guide groove SG1. That is, the first sliding guide groove SG1 slidably guides the mover 240.

The first stopper 211 is dented from the first sliding guide groove SG1. The first stopper 211 supports one end of the elastic body 250. The first stopper 211 is formed in a side wall type for supporting the one end of the elastic body 250, but not limited thereto and may be formed in any type for supporting the one end of the elastic body 250.

The second main body 220 adjoins the first main body 210 while corresponding to the second area A2 of the foldable display panel 100, and is folded in a direction of the first main body 210 so that the second area A2 of the foldable display panel 100 faces the first area A1. That is, the second main body 220 is folded together with the foldable display panel 100 in the direction of the first main body 210 so that the second area A2 of the foldable display panel 100 faces the first area A1. The second main body 220 may be formed of any material selected from an organic material, a metal material, or an inorganic material. The second main body 220 includes a second floating space FS2.

The second floating space FS2 is formed in a predetermined shape while adjoining the hinge 230, and a part of the second area A2 of the foldable display panel 100 floats over case 200.

The hinge 230 connects the first main body 210 and the second main body 220. The hinge 230 may be formed in any type as long as the first main body 210 and the second main body 220 are mutually folded, and formed in each of the first main body 210 and the second main body 220 to serve as a hinge thereof.

The mover 240 is located in the first sliding guide groove SG1 formed within the first main body 210. The mover 240 is supported by a rear surface of the foldable display panel 100, and is slidable in a direction of an end 341 of the foldable display panel in response to elastic restitution force. The mover 240 may be fixed to the rear surface of the foldable display panel 100, and sildable together with the foldable display panel 100. That is, when the mover 240 slides in a direction of an end 310 of the first main body 210 corresponding to the direction of the end 341 of the foldable display panel 100 in response to the elastic restitution force, the end 341 of the foldable display panel 100 slides together with the mover 240 in the direction of the end 310 of the first main body 210. When the end 341 of the foldable display panel 100 slides to be farther from the end 310 of the first main body 210, the mover 240 slides to be farther from the end 310 of the first main body 210. The mover 240 includes a second stopper 241.

The second stopper 241 faces the first stopper 211 with the elastic body 250 therebetween, and supports the other end of the elastic body 250. The second stopper 241 protrudes downward (outward), as illustrated, from the mover 240 in first sliding guide groove SG1. The second stopper 241 is formed in a protrusion type for supporting the other end of the elastic body 250, but not limited thereto and may be formed in any type for supporting the other end of the elastic body 250.

The elastic body 250 is a coiled compression spring, and mounted between the first main body 210 and the mover 240. The elastic body 250 generates elastic restitution force in the direction of the end 310 of the first main body 210 corresponding to the direction of the end 341 of the foldable display panel 100. Specifically, the coiled compression spring which is the elastic body 250 is mounted between the first stopper 211 of the first main body 210 and the second stopper 241 of the mover 240, and one end of the coiled compression spring is supported by the first stopper 211 and the other end is supported by the second stopper 241.

Meanwhile, in the display device 1000 according to the first exemplary embodiment, the mover 240 has elastic restitution force in the direction of the end 341 of the foldable display panel 100 by the elastic body 250, but a mover included in a display device according to another exemplary embodiment may have the elastic restitution force in the direction of the end 341 of the foldable display panel 100 by itself since the mover is formed of a material having elasticity.

Hereinafter, an operation of the display device 1000 according to the first exemplary embodiment will be described with reference to FIGS. 2, 3, and 4.

Figure 3:
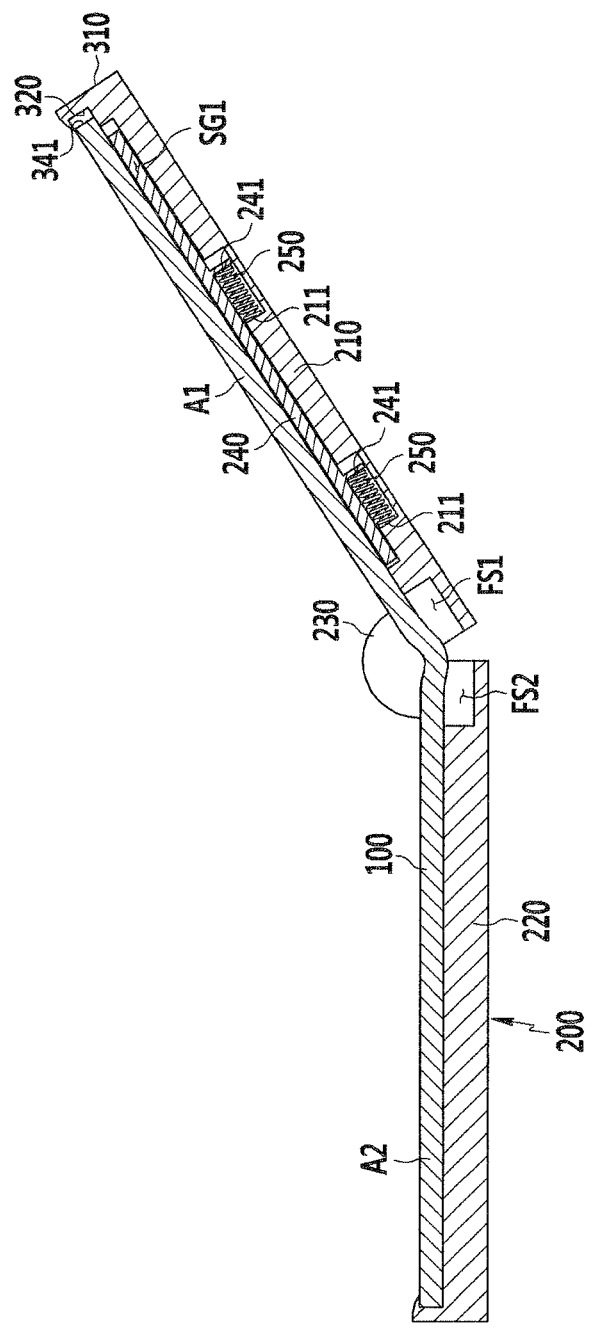
FIGS. 3 and 4 are cross-sectional views for describing an operation of the display device according to the first exemplary embodiment.
Figure 4:
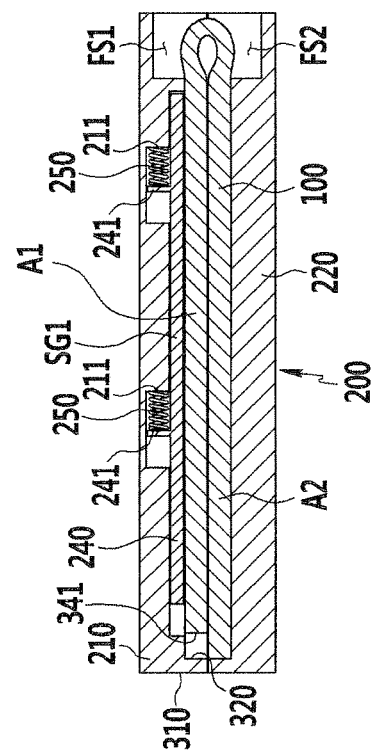

FIGS. 3 and 4 are cross-sectional views for describing the operation of the display device according to the first exemplary embodiment.

First, as illustrated in FIGS. 3 and 4, when the first main body 210 is folded in the direction of the second main body 220 so that the first area A1 of the foldable display panel 100 faces the second area A2, a center part located between the first area A1 and the second area A2 of the foldable display panel 100 is bent to have a curvature. As the center part of the foldable display panel 100 is bent, a part of each of the first area A1 and the second area A2 is inserted in each of the first floating space FS1 and the second floating space FS2, and thus an end 341 of the first area A1 of the foldable display panel 100 is slid to be farther from an end 310 of the first body 210 leaving a gap 320 between the end 341 of the first area A1 and the end 310 of the first body 210. At this time, the mover 240 slides to be farther from the end 310 of the first main body 210 together with the foldable display panel 100, and pressurizes the elastic body 250, so that the mover 240 has the elastic restitution force in the direction of the end 341 of the foldable display panel 100.

Next, as illustrated in FIG. 2, when the first main body 210 is unfolded from the second main body 220, the foldable display panel 100 is also unfolded by the case 200 so that the first area A1 and the second area A2 of the foldable display panel 100 are located in the same planer surface. At this time, the mover 240 slides in the direction of the end 310 of the first main body 210 which is the direction of the end 341 of the foldable display panel 100 in response to the elastic restitution force generated by the elastic body 250, so that the end 341 of the foldable display panel 100 slides in the direction of the end 310 of the first main body 210 together with the mover 240, thereby closing the gap 320. Accordingly, the foldable display panel 100 is formed to be flat without wrinkles on the planer surface.

As described above, the foldable display panel 100 according to the first exemplary embodiment is slidable in the direction of the end 310 of the first main body 210 in response to the elastic restitution force in a state where the mover 240 is supported by the rear surface of the foldable display panel 100, so that the planer surface of the foldable display panel 100 is formed to be flat without wrinkles in a state where the first main body 210 is unfolded from the second main body 220, thereby it is prevented to distort a quality of an image displayed by the foldable display panel 100 by the wrinkle. That is, the case 200 and the display device 1000 for improving a quality of an image displayed by the foldable display panel 100 are provided.

Also, as shown in FIG. 4, when the first main body 210 is folded in the direction of the second main body 220 so that the center part located between the first area A1 and the second area A2 is bent with a curvature, the center part of the foldable display panel 100 is inserted in each of the first floating space FS1 and the second floating space FS, so that the display device 1000 according to the first exemplary embodiment may be prevented from being damaged by stress generated by folding the center part of the foldable display panel 100.

Further, when the first main body 210 is folded in the direction of the second main body 220 so that the center part located between the first area A1 and the second area A2 is bent with the curvature, the center part of the foldable display panel 100 is inserted in each of the first floating space FS1 and the second floating space FS2, so that the display device 1000 according to the first exemplary embodiment prevents the foldable display panel 100 from being damaged by an unintended external impact since the foldable display panel 100 is not exposed to the outside when the foldable display panel 100 is folded.

Moreover, when the first main body 210 is folded in the direction of the second main body 220 so that the center part located between the first area A1 and the second area A2 of the foldable display panel 100 is bent with the curvature, the center part of the foldable display panel 100 is inserted in each of the first floating space FS1 and the second floating space FS2, so that the display device 1000 according to the first exemplary embodiment may be implemented totally in a slim type.

As described above, the case 200 for easily folding or unfolding the foldable display panel 100 and the display device 1000 including the same are provided.

Hereinafter, a display device according to a second exemplary embodiment will be described with reference to FIG. 5.

Hereinafter, only distinguishing parts different from the first exemplary embodiment will be extracted and described, and parts of which descriptions are omitted will follow the first exemplary embodiment. Further, in the second exemplary embodiment, the same reference numerals as those of the first exemplary embodiment will be used for the same components for better comprehension and ease of description.

Figure 5:
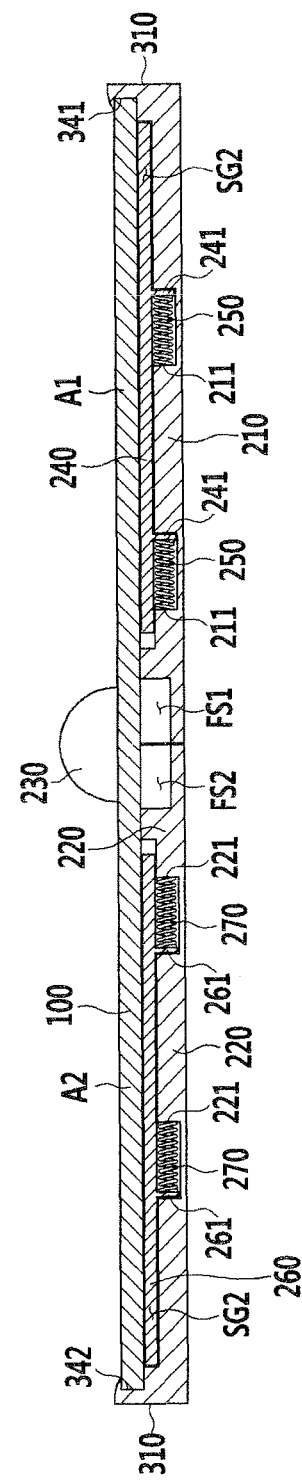
FIG. 5 is a cross-sectional view of a display device according to a second exemplary embodiment.

FIG. 5 is a cross-sectional view of the display device according to the second exemplary embodiment.

As illustrated in FIG. 5, a display device 1002 according to the second exemplary embodiment includes the foldable display panel 100 and the case 200. The case 200 supports the foldable display panel 100, and includes the first main body 210, the second main body 220, the hinge 230, the first mover 240, a second mover 260, the first elastic body 250, and a second elastic body 270. Each of the first mover 240 and the first elastic body 250 is the same component as the mover 240 and the elastic body 250 of the display device 1000 according to the first exemplary embodiment.

The second main body 220 adjoins the first main body 210 and is located to correspond to the second area A2 of the foldable display panel 100, and is folded in the direction of the first main body 210 so that the second area A2 of the foldable display panel 100 faces the first area A1. That is, the second main body 220 is folded together with the foldable display panel 100 in the direction of the first main body 210 so that the first area A1 of the foldable display panel 100 faces the second area A2. The second main body 220 may be formed of any material selected from an organic material, a metal material, or an inorganic material. The second main body 220 includes the second floating space FS2, a second sliding guide groove SG2, and a third stopper 221.

The second sliding guide groove SG2 is formed in a dented type while corresponding to the second area A2 of the foldable display panel 100. The second mover 260 is located in the second sliding guide groove SG2, and slidably guided along the second sliding guide groove SG2. That is, the second sliding guide groove SG2 slidably guides the second mover 260.

The third stopper 221 is dented from the second sliding guide groove SG2. The third stopper 211 supports one end of the second elastic body 270. The third stopper 221 is formed in a side wall type for supporting the one end of the second elastic body 270, but not limited thereto and may be formed in any type for supporting the one end of the second elastic body 270.

The second mover 260 is located in the second sliding guide groove SG2 formed within the second main body 220. The second mover 260, having the elastic restitution force, is supported by the rear surface of the foldable display panel 100, and slid in the direction of the ends of the foldable display panel 100. The second mover 260 may be fixed to the rear surface of the foldable display panel 100, and be slidable together with the foldable display panel 100. That is, when the second mover 260 slides in the direction opposite the end 342 of the foldable display panel 100 corresponding to the direction opposite the end 312 of the second main body 220, the elastic restitution force is increased, and the end 342 of the foldable display panel 100 slides together with the second mover 260 in the direction away from the end 312 of the second main body 220. When the end 342 of the foldable display panel 100 slides to be farther from the end 312 of the second main body 220, the second mover 260 slides to be farther from the end 312 of the second main body 220 together with the foldable display panel 100. The second mover 260 includes a fourth stopper 261.

The fourth stopper 261 faces the third stopper 221 with the second elastic body 270 therebetween, and supports the other end of the second elastic body 270. The fourth stopper 261 protrudes downward (outward), as illustrated, from the mover 260 in the second sliding guide groove SG2. The fourth stopper 261 is formed in a protrusion type for supporting the other end of the second elastic body 270, but not limited thereto and may be formed in any type for supporting the other end of the second elastic body 270.

The second elastic body 270 is a coiled compression spring, and mounted between the second main body 220 and the second mover 260. The second elastic body 270 generates the elastic restitution force in the direction of the end 312 of the second main body 220 corresponding to the direction of the end 342 of the foldable display panel 100. Specifically, the coiled compression spring which is the second elastic body 270 is mounted between the third stopper 221 of the second main body 220 and the fourth stopper 261 of the second mover 260, and one end of the coiled compression spring is supported by the third stopper 221 and the other end is supported by the fourth stopper 261.

Meanwhile, in the display device 1002 according to the second exemplary embodiment, the second mover 260 has elastic restitution force in the direction of the end 342 of the foldable display panel 100 by the second elastic body 270, but the second mover 260 may have the elastic restitution force in the direction of the end 342 of the foldable display panel 100 by itself since the second mover 260 is formed of a material having elasticity.

Hereinafter, an operation of the display device 1002 according to the second exemplary embodiment will be described.

First, when the first main body 210 is folded in the direction of the second main body 220 so that the first area A1 of the foldable display panel 100 faces the second area A2, the center part located between the first area A1 and the second area A2 of the foldable display panel 100 is bent with the curvature. As the center part of the foldable display panel 100 is bent, parts of the first area A1 and the second area A2 are inserted in the first floating space FS1 and the second floating space FS2, respectively, and thus the end 341 of the first area A1 and the end 342 of the second area A2 of the foldable display panel 100 slide to be farther from the end 310 of the first main body 210 and the end 312 of the second main body 220, respectively.

At this time, the first mover 240 and the second mover 260 slide to be farther from the end 310 of the first main body 210 and the end 312 of the second main body 220 together with the foldable display panel 100, and thus pressurize the first elastic body 250 and the second elastic body 270, respectively, so that the first mover 240 and the second mover 260 have the elastic restitution force in the directions of both ends 341 and 342 of the foldable display panel 100, respectively.

Next, when the first main body 210 is unfolded from the second main body 220 so that the first area A1 and the second area A2 of the foldable display panel 100 are located on the same planer surface, the foldable display panel 100 is also unfolded by the case 200. At this time, the first mover 240 and the second mover 260 slide in the direction of end 310 of the first main body 210 and the end 312 of the second main body 220 corresponding to the directions of both ends of the foldable display panel 100 in response to the elastic restitution force generated by the first elastic body 250 and the second elastic body 270, respectively, so that both ends of the foldable display panel 100 slide together with the first mover 240 and the second mover 260 in the directions of the end 310 of the first main body 210 and the end 312 of the second main body 220, respectively. Accordingly, the foldable display panel 100 is formed to be flat without wrinkles on the planer surface.

As described above, the display device 1002 according to the second exemplary embodiment includes a slidable and foldable display panel 100 attached to the first mover 240 and the second mover 260, each having the elastic restitution force in a state where each of the first mover 240 and the second mover 260 is supported by the rear surface of the foldable display panel 100, so that the planer surface of the foldable display panel 100 is formed to be flat without wrinkles in a state where the first main body 210 is unfolded from the second main body 220, thereby it is prevented to distort a quality of an image displayed by the foldable display panel 100 by the wrinkle. That is, the case 200 and the display device 1002 for improving the quality of the image displayed by the display panel 100 are provided.

Hereinafter, a display device according to a third exemplary embodiment will be described with reference to FIGS. 6 and 7.

Hereinafter, only distinguishing parts different from the first exemplary embodiment will be extracted and described, and parts of which descriptions are omitted will follow the first exemplary embodiment. Further, in the third exemplary embodiment, the same reference numerals as those of the first exemplary embodiment will be used for the same components for better comprehension and ease of description.

Figure 6:
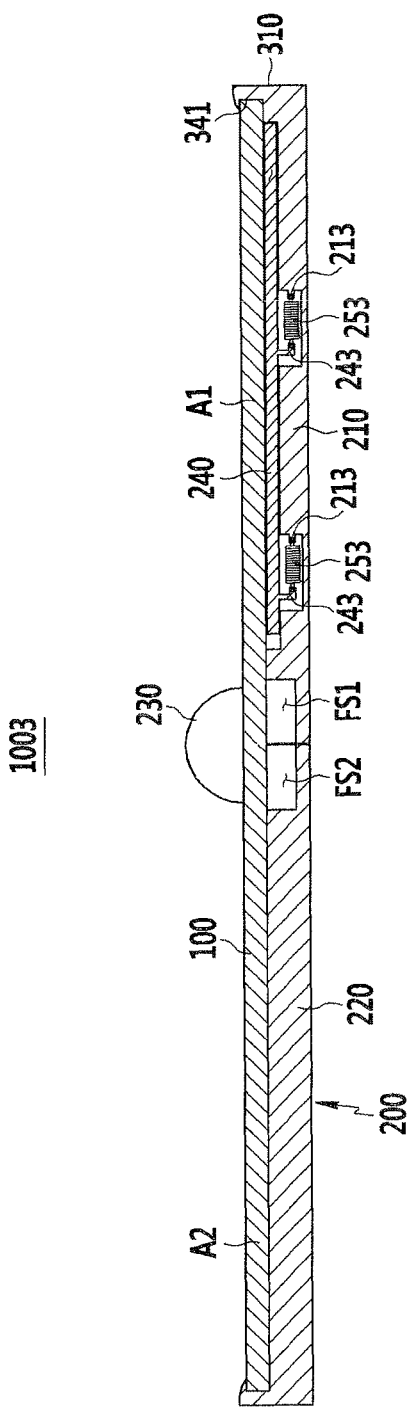
FIG. 6 is a cross-sectional view of a display device according to a third exemplary embodiment.

FIG. 6 is a cross-sectional view of the display device according to the third exemplary embodiment.

As illustrated in FIG. 6, a display device 1003 according to the third exemplary embodiment includes the foldable display panel 100 and the case 200.

The case 200 supports the foldable display panel 100, and includes the first main body 210, the second main body 220, the hinge 230, the mover 240, and an elastic body 253.

The first main body 210 includes the first floating space FS1, the first sliding guide groove SG1, and a first fastener 213.

The first fastener 213 is dented from the first sliding guide groove SG 1. The first fastener 213 is fastened to one end of the elastic body 253. The first fastener 213 is formed in a side wall type fastened to the one end of the elastic body 253, but not limited thereto and may be formed in any type fastened to the one end of the elastic body 253.

The mover 240 includes a second fastener 243.

The second fastener 243 faces the first fastener 213 with the elastic body 253 therebetween, and is fastened to the other end of the elastic body 253. The second fastener 243 protrudes downward (as illustrated) from the mover 240 in a direction of the first fastener 213. The second fastener 243 is formed in a protrusion type fastened to the other end of the elastic body 253, but not limited thereto and may be formed in any type fastened to the other end of the elastic body 253.

The elastic body 253 is a coiled tension spring, and mounted between the first main body 210 and the mover 240. The elastic body 253 generates the elastic restitution force in the direction of the end 310 of the first main body 210 corresponding to the direction of the end 341 of the foldable display panel 100. Specifically, the coiled tension spring which is the elastic body 253 is mounted between the first fastener 213 of the first main body 210 and the second fastener 243 of the mover 240, and one end of the coiled tension spring is fastened to the first fastener 213 and the other end is fastened to the second fastener 243.

Hereinafter, an operation of the display device 1003 according to the third exemplary embodiment will be described with reference to FIGS. 6 and 7.

Figure 7:
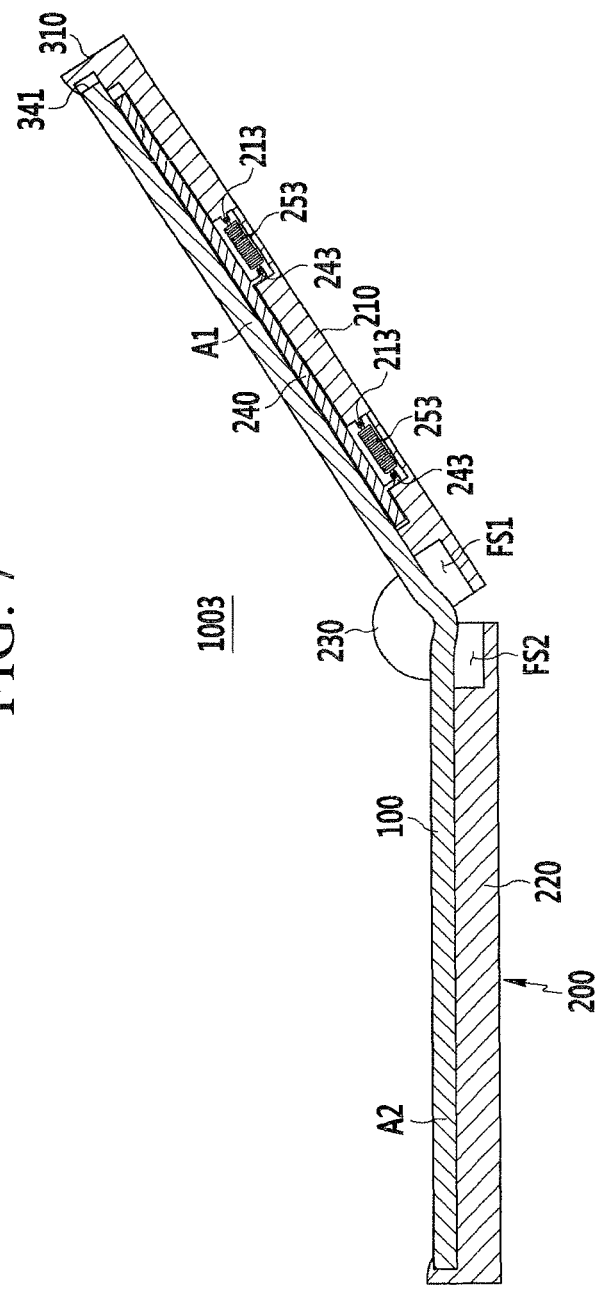
FIG. 7 is a cross-sectional view for describing an operation of the display device according to the third exemplary embodiment.

FIG. 7 is a cross-sectional view for the operation of the display device according to the third exemplary embodiment.

First, as illustrated in FIG. 7, when the first main body 210 is folded in the direction of the second main body 220 so that the first area A1 of the foldable display panel 100 faces the second area A2, the center part located between the first area A1 and the second area A2 of the foldable display panel 100 is bent with the curvature.

As the center part of the foldable display panel 100 is bent, parts of the first area A1 and the second area A2 are inserted in the first floating space FS1 and the second floating space FS2, respectively, and thus the end 341 of the first area A1 of the foldable display panel slides to be farther from the end 310 of the first main body 210. At this time, the mover 240 slides to be farther from the end 310 of the first main body 210 together with the foldable display panel 100, and thus pressurizes the elastic body 253, so that the mover 240 has the elastic restitution force in the direction of the end 341 of the foldable display panel 100.

Next, as illustrated in FIG. 6, when the first main body 210 is unfolded from the second main body 220 so that the first area A1 and the second area A2 of the foldable display panel 100 are located on the same planer surface, the foldable display panel 100 is also unfolded by the case 200. At this time, the mover 240 slides in the direction of the end 310 of the first main body 210 corresponding to the direction of end 341 of the foldable display panel 100 in response to the elastic restitution force generated by the elastic body 253, so that the end 341 of the foldable display panel 100 slides together with the mover 240 in the direction of the end 310 of the first main body 210. Accordingly, the foldable display panel 100 is formed to be flat without wrinkles on the planer surface.

As described above, the foldable display panel 100 according to the third exemplary embodiment is slidable in the direction of the end 310 of the first main body 210 of the in response to the elastic restitution force in a state where the mover 240 is supported by the rear surface of the foldable display panel 100, so that the planer surface of the foldable display panel 100 is formed to be flat without wrinkles in a state where the first main body 210 is unfolded from the second main body 220, thereby it is prevented to distort a quality of an image displayed by the foldable display panel 100 by the wrinkle. That is, the case 200 and the display device 1003 for improving the quality of the image displayed by the display panel 100 are provided.

Hereinafter, a display panel according to a fourth exemplary embodiment will be described with reference to FIGS. 8 and 9.

Hereinafter, only distinguishing parts different from the first exemplary embodiment will be extracted and described, and parts of which descriptions are omitted will follow the first exemplary embodiment. Further, in the fourth exemplary embodiment, the same reference numerals as those of the first exemplary embodiment will be used for the same components for better comprehension and ease of description.

Figure 8:
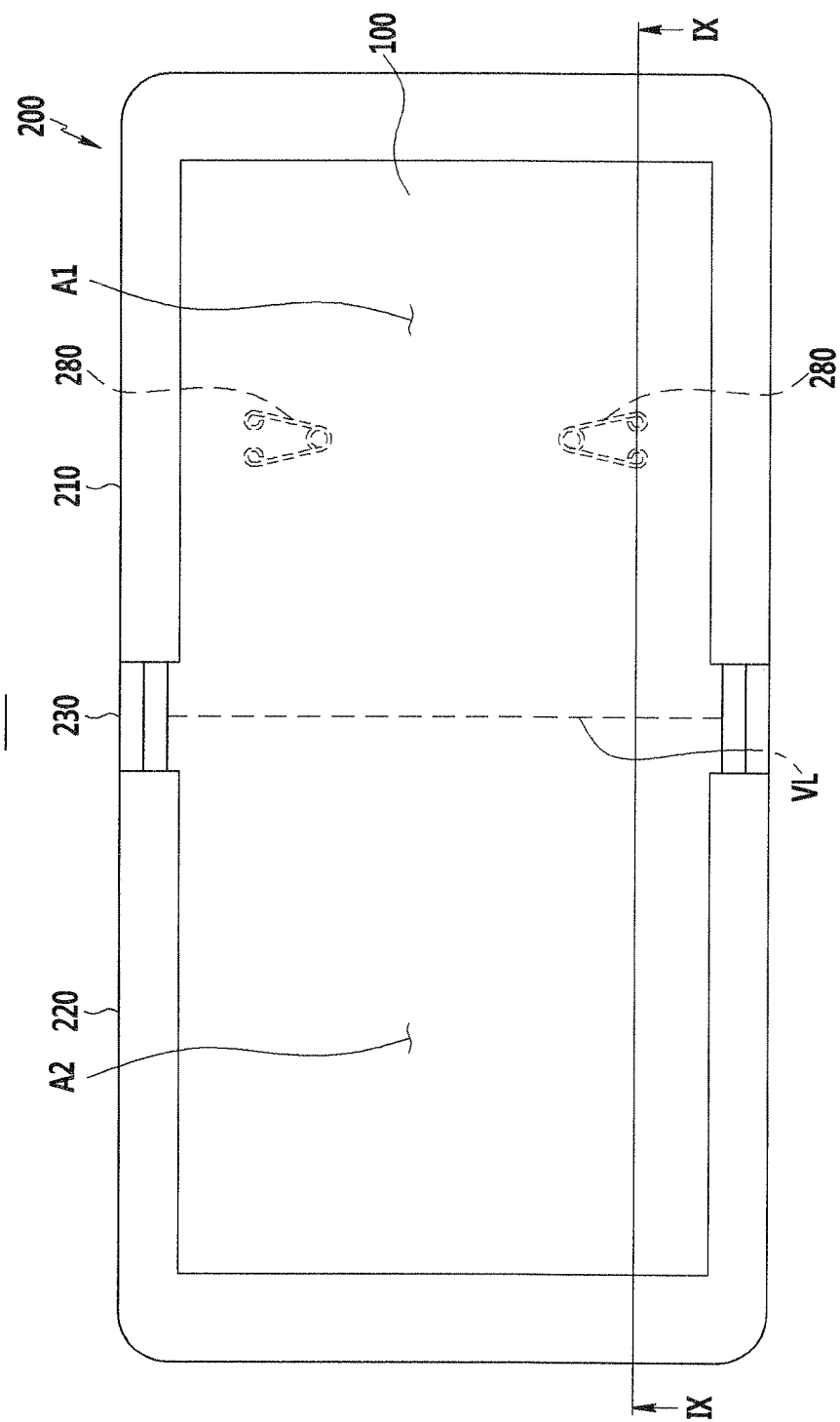
FIG. 8 is a top plan view of a display device according to a fourth exemplary embodiment.

FIG. 8 is a top plan view of the display device according to the fourth exemplary embodiment. FIG. 9 is a cross-sectional view of the display device taken along the line IX-IX of FIG. 8.

Figure 9:
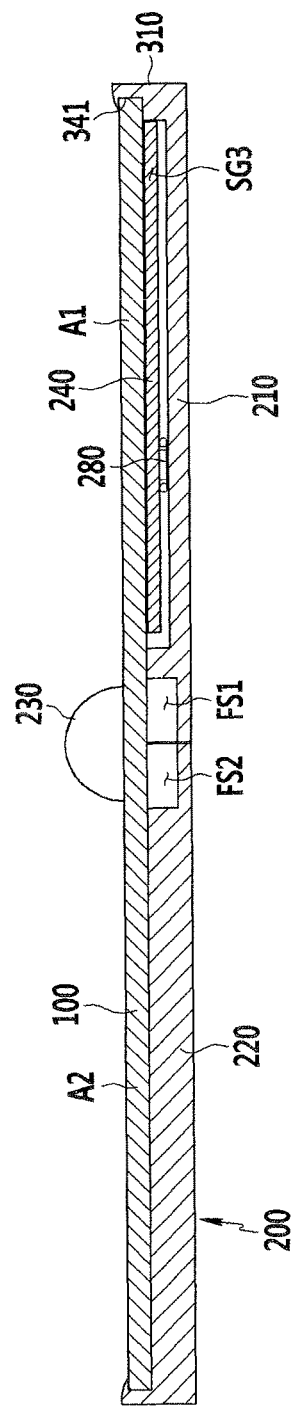
FIG. 9 is cross-sectional view of the display device taken along the line IX-IX of FIG. 8.

As illustrated in FIGS. 8 and 9, a display device 1004 according to the fourth exemplary embodiment includes the foldable display panel 100 and the case 200.

The case 200 supports the display panel 100. The case 200 may cover an edge of the foldable display panel 100. The case 200 includes the first main body 210, the second main body 220, the hinge 230, the mover 240, and an elastic body 280.

The first main body 210 includes the first floating space FS1 and a sliding guide groove SG3. In this case, the sliding guide groove SG3 is narrower than sliding guide groove SG1 of the first embodiment due to the absence of the dented portion of sliding guide groove SG1 in which the elastic body 250 is positioned.

The elastic body 280 is a torsion spring. One end of the torsion spring, which the elastic body 280, is fixed to the first main body 210, and the other end is fixed to the mover 240.

Hereinafter, an operation of the display device 1004 according to the fourth exemplary embodiment will be described with reference FIGS. 9 and 10.

Figure 10:
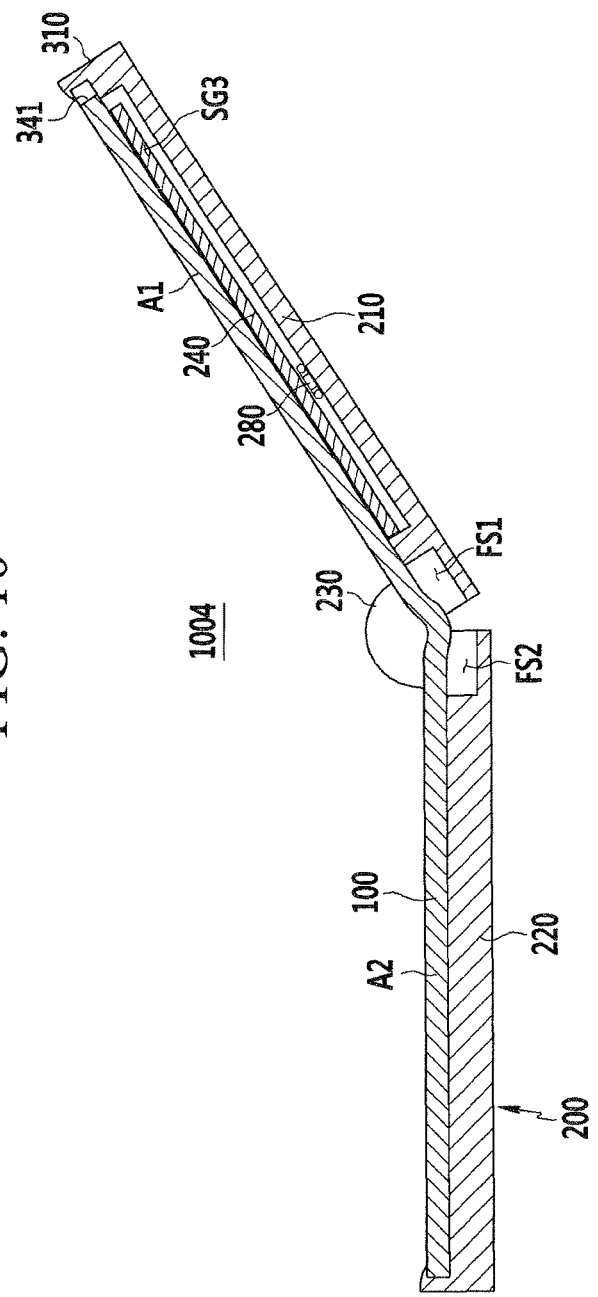
FIG. 10 is a cross-sectional view for describing an operation of the display device according to a fourth exemplary embodiment.

FIG. 10 is a cross-sectional view for describing the operation of the display panel according to the fourth exemplary embodiment.

First, as illustrated in FIG. 10, when the first main body 210 is folded in the direction of the second main body 220 so that the first area A1 of the foldable display panel 100 faces the second area A2, the center part located between the first area A1 and the second area A2 of the foldable display panel 100 is bent with the curvature. As the center part of the foldable display panel 100 is bent, parts of the first area A1 and the second area A2 are inserted in the first floating space FS1 and the second floating space FS2, respectively, and thus the end 341 of the first area A1 of the foldable display panel 100 slides to be farther from the end 310 of the first main body 210. At this time, the mover 240 slides to be farther from the end 310 of the first main body 210 together with the foldable display panel 100, and thus pressurizes the elastic body 280, so that the mover 240 has the elastic restitution force in the direction of the end 341 of the foldable display panel 100.

Next, as illustrated in FIG. 9, when the first main body is unfolded from the second main body 220 so that the first area A1 and the second area A2 of the foldable display panel 100 are located on the same planer surface, the foldable display panel 100 is also unfolded by the case 200. At this time, the mover 240 slides in the direction of the end 310 of the first main body 210 corresponding to the direction of the end 341 of the foldable display panel 100 in response to the elastic restitution force generated by the elastic body 280, so that the end of the foldable display panel 100 slides together with the mover 240 in the direction of the end 310 of the first main body 210. Accordingly, the foldable display panel 100 is formed to be flat without wrinkles on the planer surface.

As described above, the mover 240 of the display device 1004 according to the fourth exemplary embodiment is slidable in the direction of the end 341 of the foldable display panel 100 in response to the elastic restitution force in a state where the mover 240 is supported by the rear surface of the foldable display panel 100, so that the planer surface of the foldable display panel 100 is formed to be flat without wrinkles in a state where the first main body 210 is unfolded from the second main body 220, thereby it is prevented to distort a quality of an image displayed by the foldable display panel 100 by the wrinkle. That is, the case 200 and the display device 1004 for improving the quality of the image displayed by the foldable display panel 100 are provided.

Further, in the display device 1004 according to the fourth exemplary embodiment, since the elastic body 280 is formed of the torsion spring and directly fixed to each of the first main body 210 and the mover 240, an area of a space where the elastic body 280 is located may be small. The small area acts as a factor by which a total thickness of the display device 1004 may be slim. That is, the display device 1004 having a slim thickness is provided.

Hereinafter, a display device according to a fifth exemplary embodiment will be described with reference to FIG. 11.

Hereinafter, only distinguishing parts different from the first exemplary embodiment will be extracted and described, and parts of which description are omitted will follow the first exemplary embodiment. Further, in the fifth exemplary embodiment, the same reference numerals as those of the first exemplary embodiment will be used for the same components for better comprehension and ease of description.

FIG. 11 is a top plan view of the display device according to the fifth exemplary embodiment.

As illustrated in FIG. 11, a display device 1005 according to the fifth exemplary embodiment includes the foldable display panel 100 and the case 200.

The case 200 supports the foldable display panel 100, and includes the first main body 210, the second main body 220, the hinge 230, the mover 240, and an elastic body 290.

The first main body 210 includes the first floating space FS1, and a sliding guide groove SG4.

The mover 240 is located in the sliding guide groove SG4 formed within the first main body 210. The mover 240 is supported by the rear surface of the foldable display panel 100, and slidable in the direction of one end of the foldable display panel 100 in response to the elastic restitution force. The mover 240 may be fixed to the rear surface of the foldable display panel 100, and slid together with the foldable display panel 100. When the end of the foldable display panel 100 slides to be farther from the corresponding end of the first main body 210, the mover 240 also slides to be farther from the end of the first main body together with the foldable display panel 100. The mover 240 includes taper (ratchet-like) surface 245.

The taper surface 245 tapers in a sliding direction of the mover 240, and an end of the elastic body 290 comes into contact with the taper surface 245.

The end of the elastic body 290 comes into contact with the taper surface 245 of the mover 240, and the mover 240 has the elastic restitution force in the direction of the end (right end, as illustrated) of the foldable display panel 100 as the elastic restitution force is generated in an intersection direction crossing the sliding direction of the mover 240. The elastic body 290 includes a supporting base 291, a supporting shaft 292, a tip part 293, and a coiled compression spring 294.

The supporting base 291 is located in a side portion of the first main body 210, and supported by the first main body 210.

The supporting shaft 292 extends towards the taper surface 245 of the mover 240 from the supporting base 291 along the intersection direction.

The tip part 293 has a rounded shape to minimize frictional force between the tip part 293 and the taper surface 245, and is supported by an end of the supporting shaft 292. The tip part 293 comes into contact with the taper surface 245, and is movable in the intersection direction along the taper surface 245.

The supporting shaft 292 is inserted in the coiled compression spring 294, and the coiled compression spring 294 is mounted between the tip part 293 and the supporting shaft 292.

Hereinafter, an operation of the display device 1005 according to the fifth exemplary embodiment will be described.

First, when the first main body 210 is folded in the direction of the second main body 220 so that the first area A1 of the foldable display panel 100 faces the second area A2, the center part located between the first area A1 and the second area A2 of the foldable display panel 100 is bent with the curvature. As the center part of the foldable display panel 100 is bent, parts of the first area A1 and the second area A2 are inserted in the first floating space FS1 and the second floating space FS2, respectively (not shown), and thus the end of the first area A1 of the foldable display panel 100 slides to be farther from the end of the first main body 210. At this time, the mover 240 slides to be farther from the end of the first main body 210 together with the foldable display panel 100, and then the tip part 293 of the elastic body 290 in contact with the taper surface 245 moves towards support base 291 and pressurizes the coiled compression spring 294, and thus the elastic body 290 generates the elastic restitution force in a direction of the taper surface 245 corresponding to the intersection direction. Here, the mover 240 has the elastic restitution force in the direction of the end of the first main body 210 with the aid of elastic body 290 pressing against taper surface 245.

Next, when the first main body 210 is unfolded from the second main body 220 so that the first area A1 and the second area A2 of the foldable display panel 100 are located on the same planer surface, the foldable display panel 100 is also unfolded by the case 200. At this time, the mover 240 slides in the direction of the end of the first main body 210 in response to the elastic restitution force generated by the elastic body 290, so that the foldable display panel 100 slides together with the mover 240 in the direction of the end of the first main body 210. Accordingly, the foldable display panel 100 is formed to be flat without wrinkles on the planer surface.

As described above, foldable display panel 100 according to the fifth exemplary embodiment is slidable in the direction of the end of the first main body 210 in response to the elastic restitution force of elastic body 290 in a state where the mover 240 is supported by the rear surface of the foldable display panel 100, so that the planer surface of the foldable display panel 100 is formed to be flat without wrinkles in a state where the first main body 210 is unfolded from the second main body 220, thereby it is prevented to distort a quality of an image displayed by the foldable display panel 100 by the wrinkle. That is, the case 200 and the display device 1005 for improving the quality of the image displayed by the foldable display panel 100 are provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A case for supporting a foldable display panel, the case comprising:
   a first main body located to correspond to a first area of the foldable display panel;
   a second main body located to adjoin the first main body and correspond to a second area of the foldable display panel, the first main body being foldable in a direction of the second main body so that the first area of the foldable display panel faces the second area;
   a mover, responsive to an elastic restitution force, located within one or more of the first main body and the second main body to be supported by a rear surface of the foldable display panel, and slidable in a direction of an end of the foldable display panel; and
   an elastic body in direct physical contact with the mover, the elastic body being mounted between one or more of the first main body and the mover, and the second main body and the mover, the elastic body being compressed when the first main body is folded in the direction of the second main body and configured to generate the elastic restitution force.

2. The case of claim 1, further comprising:
   a hinge for connecting the first main body and the second main body.

3. The case of claim 2, wherein:
   each of the first main body and the second main body includes a floating space adjoining the hinge and floating the foldable display panel.

4. The case of claim 3, wherein:
   a part of each of the first area and the second area of the foldable display panel is floated in the floating space.

5. The case of claim 1, wherein:
   one or more of the first main body and the second main body include a sliding guide groove for slidably guiding the mover.

6. The case of claim 1, wherein:
   the elastic body includes a coiled compression spring.

7. The case of claim 6, wherein:
   one or more of the first main body and the second main body include a first stopper by which one end of the coiled compression spring is supported, and
   the mover includes a second stopper by which the other end of the coiled compression spring is supported.

8. The case of claim 1, wherein:
   the elastic body includes a coiled tension spring.

9. The case of claim 8, wherein:
   one or more of the first main body and the second main body include a first fastener for fastening one end of the coiled tension spring, and
   the mover includes a second fastener for fastening the other end of the coiled tension spring.

10. The case of claim 1, wherein:
    the elastic body includes a torsion spring.

11. The case of claim 10, wherein:
    one end of the torsion spring is fixed to the first main body or the second main body, and the other end of the torsion spring is fixed to the mover.

12. The case of claim 1, wherein:
    the mover includes a taper surface tapering in a sliding direction of the mover, and
    the elastic body comes into contact with the taper surface, and generates the elastic restitution force in an intersection direction crossing the sliding direction of the mover.

13. The case of claim 12, wherein the elastic body includes:
    a supporting base supported by one or more of the first main body and the second main body;
    a supporting shaft extending towards the taper surface from the supporting base along the intersection direction;
    a rounded tip part supported by an end of the supporting shaft to be slidable in the intersection direction, and coming into contact with the taper surface; and
    a coiled compression spring having the supporting shaft inserted therein and mounted between the tip part and the supporting base.

14. A display device comprising:
    a foldable display panel for display an image; and
    the case for supporting the foldable display panel of claim 1.

* * * * *